US008209141B2

(12) United States Patent
Bassett et al.

(10) Patent No.: US 8,209,141 B2
(45) Date of Patent: Jun. 26, 2012

(54) SYSTEM AND METHOD FOR AUTOMATICALLY GENERATING TEST PATTERNS FOR AT-SPEED STRUCTURAL TEST OF AN INTEGRATED CIRCUIT DEVICE USING AN INCREMENTAL APPROACH TO REDUCE TEST PATTERN COUNT

(75) Inventors: Robert W. Bassett, Essex Junction, VT (US); Andrew Ferko, Waterbury, VT (US); Vikram Iyengar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 419 days.

(21) Appl. No.: 12/547,637

(22) Filed: Aug. 26, 2009

(65) Prior Publication Data
US 2010/0235136 A1    Sep. 16, 2010

Related U.S. Application Data

(60) Provisional application No. 61/159,166, filed on Mar. 11, 2009.

(51) Int. Cl.
*G01R 31/00* (2006.01)
*G06F 11/30* (2006.01)
(52) U.S. Cl. ......... 702/120; 702/182; 714/738; 714/739
(58) Field of Classification Search .................. 702/117, 702/118, 119, 120, 123, 182, 183, 185; 714/29, 714/724, 726, 727, 738, 739; 324/762.02
See application file for complete search history.

(56) References Cited

U.S. PATENT DOCUMENTS

| 6,182,258 B1 | 1/2001 | Hollander |
| 6,237,117 B1 | 5/2001 | Krishnamoorthy |
| 6,347,388 B1 | 2/2002 | Hollander |
| 6,530,054 B2 | 3/2003 | Hollander |

(Continued)

OTHER PUBLICATIONS

Pandey, et al., "An Incremental Algorithm for Test Generation in Illinois Scan Architecture Based Designs," IEEE Computer Society, Proceedings of the 2002 Design, Automation and Test in Europe Conference and Exhibition, 2002, pp. 1-8.
Copty, et al., "Intelligent Interleaving of Scenarios: A Novel Approach to System Level Test Generation," 48.1, DAC 2007, Jun. 4-8, 2007. pp. 891-895.

(Continued)

*Primary Examiner* — John H Le
(74) *Attorney, Agent, or Firm* — Gibb I.P. Law Firm, LLC; Michael J. LeStrange, Esq.

(57) ABSTRACT

Disclosed are embodiments of a system and method for automatically selecting and generating test patterns for an at-speed structural test of an integrated circuit device. Specifically, a test pattern generation pass is started and proceeds until the "knee" of the simulated test coverage curve is observed. Next, the test patterns are optionally reordered and some are removed. Then, another test pattern generation pass is started. The process is repeated iteratively until some predetermined final stopping criterion is met. By performing multiple test pattern generation passes and reducing the number of available test patterns that can be generated with each pass, the method exploits the initial increase in the test coverage curve inherent in each pass and limits the overall test pattern count.

25 Claims, 7 Drawing Sheets

U.S. PATENT DOCUMENTS

| | | |
|---|---|---|
| 6,675,323 B2 | 1/2004 | Bartenstein et al. |
| 6,707,313 B1 | 3/2004 | Rohrbaugh et al. |
| 6,986,090 B2 | 1/2006 | Hathaway et al. |
| 7,669,101 B2 * | 2/2010 | Udell et al. .................. 714/738 |
| 7,765,450 B2 * | 7/2010 | Udell et al. .................. 714/739 |
| 2003/0115525 A1 | 6/2003 | Hill et al. |
| 2005/0102572 A1 | 5/2005 | Oberlaender |
| 2005/0188287 A1 | 8/2005 | Combs et al. |
| 2008/0222472 A1 | 9/2008 | Grise et al. |

OTHER PUBLICATIONS

So, et al. "ICAT" Incremental Combinational ATPG, VLSI Test Symposium, 1994, Proceedings, 12$^{th}$ IEEE, Apr. 25-28, 1994, pp. 106-113.

Silberman, et al., "Functional Fault Simulation as a Guide for Biased-Random Test Pattern Generation," Computers, IEEE Transactions, vol. 40, Issue 1, Jan. 1991, pp. 66-79.

* cited by examiner

SYSTEM AND METHOD FOR AUTOMATICALLY GENERATING TEST PATTERNS FOR AT-SPEED STRUCTURAL TEST OF AN INTEGRATED CIRCUIT DEVICE USING AN INCREMENTAL APPROACH TO REDUCE TEST PATTERN COUNT

Applicant claims the benefit of Provisional Application Ser. No. 61/159,166, System and Method for Automatically Generating Test Patterns for At-Speed Structural Test of an Integrated Circuit Device Using an Incremental Approach to Reduce Test Pattern Count, filed on Mar. 11, 2009.

BACKGROUND

1. Field of the Invention

The embodiments of the invention generally relate to integrated circuit device at-speed structural testing techniques and, more specifically, to a system and method for automatically generating test patterns for an at-speed structural test of an integrated circuit device using an incremental approach to reduce test pattern count.

2. Description of the Related Art

An automatic test pattern generator (ATPG) is a computer system that uses software tools to generate test patterns (i.e., input/test sequences) that, when applied to a level sensitive scan design (LSSD)), enable testers to distinguish between circuit behavior that is desirable and circuit behavior that is indicative of design or manufacturing defects. At-speed structural testing techniques use such ATPGs to select and generate test patterns when testing for defects, such as high impedance shorts, in-line resistance or cross-talk between signals, which are only apparent when the integrated circuit device is run at speed.

Unfortunately, during at-speed testing, misalignment of clock signals can occur as signals are exchanged between different circuit partitions, e.g., clock domains, power domains, etc. To prevent such asynchronous captures across clock domains, functional clock domains are typically tested one domain at a time (see U.S. Patent Application Publication No. US 2008/0222472 of Grise et al., which is incorporated herein by reference). As a result, test pattern count can be high, especially for large domains. Therefore, there is a need in the art for a method for automatically generating test patterns for an at-speed structural test of an integrated circuit device that reduces test pattern count. Moreover, as automatic test generation for a large domain proceeds, a knee in the coverage curve is observed after a point, beyond which each additional pattern does not detect a large number of faults. The problem being solved in the present invention is how to cut off test generation for large domains in ASST, such that the highest test coverage may be achieved while remaining below a test pattern budget.

SUMMARY

In view of the foregoing, disclosed herein are embodiments of a system and method for automatically selecting and generating test patterns for an at-speed structural test of an integrated circuit device. The embodiments use an incremental approach to test pattern selection and generation. Specifically, a test pattern generation pass is started and proceeds until the "knee" of the simulated test coverage curve is observed (i.e., until the percentage of simulated faults detected no longer increases or only minimally increases with each new test pattern generated). Next, the test patterns are optionally reordered and some are removed. Then, another test pattern generation pass is started. The process is repeated iteratively until some predetermined final stopping criterion is met. By performing multiple test pattern generation passes and reducing the number of available test patterns that can be generated with each pass, the method exploits the initial increase in the test coverage curve inherent in each pass and limits the overall test pattern count.

Specifically, disclosed herein are embodiments of a system for automatically selecting and generating test patterns for an at-speed structural test of a circuit partition group of an integrated circuit device. The system can comprise at least an automatic test pattern generator (ATPG) and a data analyzer. The ATPG can perform a first test pattern generation pass for the circuit partition group. During this first test pattern generation pass, the ATPG can serially generate test patterns from a set of available test patterns. Additionally, during the first test pattern generation pass, the data analyzer can determine test coverage with each test pattern generated. That is, the analyzer can determine the percentage of simulated faults detected with each generated test pattern. After each test pattern is generated and test coverage is determined, the analyzer can communicate the test coverage back to the ATPG. Then, when at least one predetermined stopping criterion related to the test coverage is met, the ATPG can stop the first test pattern generation pass such that only a sub-set of available test patterns is actually generated. This sub-set will comprise less than all of the available test patterns in the set.

Next, the ATPG can, optionally, reorder the test patterns in the sub-set. For example, the ATPG can rank the test patterns based on usefulness (i.e., based on the number simulated faults detected with each test pattern generated). Then, the ATPG can remove at least one of the test patterns from the sub-set. For example, the ATPG can remove the least useful test pattern(s) (i.e., the test pattern(s) associated with the least number of detected faults). After the test patterns in the sub-set are re-ordered (optionally) and after one or more of the test patterns in the sub-set are removed, the ATPG can perform a second test pattern generation pass for the circuit partition group.

During this second test pattern generation pass, the ATPG can serially generate test patterns from the remaining test patterns in the sub-set and can again stop when at least one predetermined stopping criterion related to test coverage is met. The ATPG can perform additional test pattern generation passes in this same manner until at least one predetermined final stopping criterion is met. By performing multiple test pattern generation passes and reducing the number of available test patterns that can be generated with each pass, the system exploits the initial increase in the test coverage curve inherent in each pass and limits the overall test pattern count.

Also disclosed herein are embodiments of a method for automatically selecting and generating test patterns for an at-speed structural test of a circuit partition group of an integrated circuit device. The method embodiments can comprise performing a first test pattern generation pass for the circuit partition group. The first test pattern generation pass can comprise serially generating test patterns from a set of available test patterns. During this first test pattern generation pass, test coverage (i.e., a percentage of simulated faults detected) can be determined with each test pattern generated. Then, based on at least one predetermined stopping criterion related to the test coverage, the first test pattern generation pass can be stopped such that only a sub-set (i.e., less than all) of the available test patterns is generated.

Next, the test patterns in the sub-set can optionally be re-ordered. For example, the test patterns in the sub-set can be ranked based on usefulness (i.e., based on the number of simulated faults detected with each test pattern). Then, at least one test pattern can be removed from the sub-set. For example, the least useful test pattern(s) can be removed (i.e., the test patterns associated with the least number of detected faults can be removed). After the test patterns in the sub-set are optionally re-ordered and after one or more of the test patterns are removed from the sub-set, a second test pattern generation pass for the circuit partition group can be performed.

The second test pattern generation pass can comprise serially generating test patterns from the remaining test patterns in the sub-set and can be stopped when at least one predetermined criterion related to test coverage is met. Additional test pattern generation passes can be repeated in this same manner until at least one predetermined final stopping criterion is met. That is, the above-described test pattern generation, stopping, re-ordering and removing processes can be repeatedly performed until at least one predetermined final stopping criterion is met. By performing multiple test pattern generation passes and reducing the number of available test patterns that can be generated with each pass, the method exploits the initial increase in the test coverage curve inherent in each pass and limits the overall test pattern count.

Finally, also disclosed is a computer program product comprising a computer usable medium having computer useable program code embodied therewith. The computer usable program code is configured to perform the above-described method for automatically generating test patterns for at-speed structural test of a partition group of an integrated circuit device.

BRIEF DESCRIPTION OF THE SEVERAL VIEWS OF THE DRAWINGS

The embodiments of the invention will be better understood from the following detailed description with reference to the drawings, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

An automatic test pattern generator (ATPG) is a computer system that uses software tools to generate test patterns (i.e., input/test sequences) that, when applied to a level sensitive scan design (LSSD)), enable testers to distinguish between circuit behavior that is desirable and circuit behavior that is indicative of design or manufacturing defects. At-speed structural testing techniques use such ATPGs to select and generate test patterns when testing for defects, such as high impedance shorts, in-line resistance or cross-talk between signals, which are only apparent when the integrated circuit device is run at speed.

Those skilled in the art will recognize that large integrated circuit devices are often partitioned into smaller sub-circuits (i.e., circuit partitions) for the purpose of test generation using an ATPG, to reduce the complexity of test generation for the entire circuit by testing the smaller partitions independently. Large circuits may be partitioned into clock domains, power domains, or any other suitable partitions that do or do not require any of a set of different test types. For the purposes of illustration, functional clock domains and/or power domains are used herein as examples of general circuit partitions, without any loss of generality with respect to the applicability of the invention to other types of circuit partitions. It should be noted that the applicability of the invention is not limited to integrated circuit devices partitioned by clock domain or power domain and that the invention is fully applicable to circuit partitions of any type.

Figure 7:
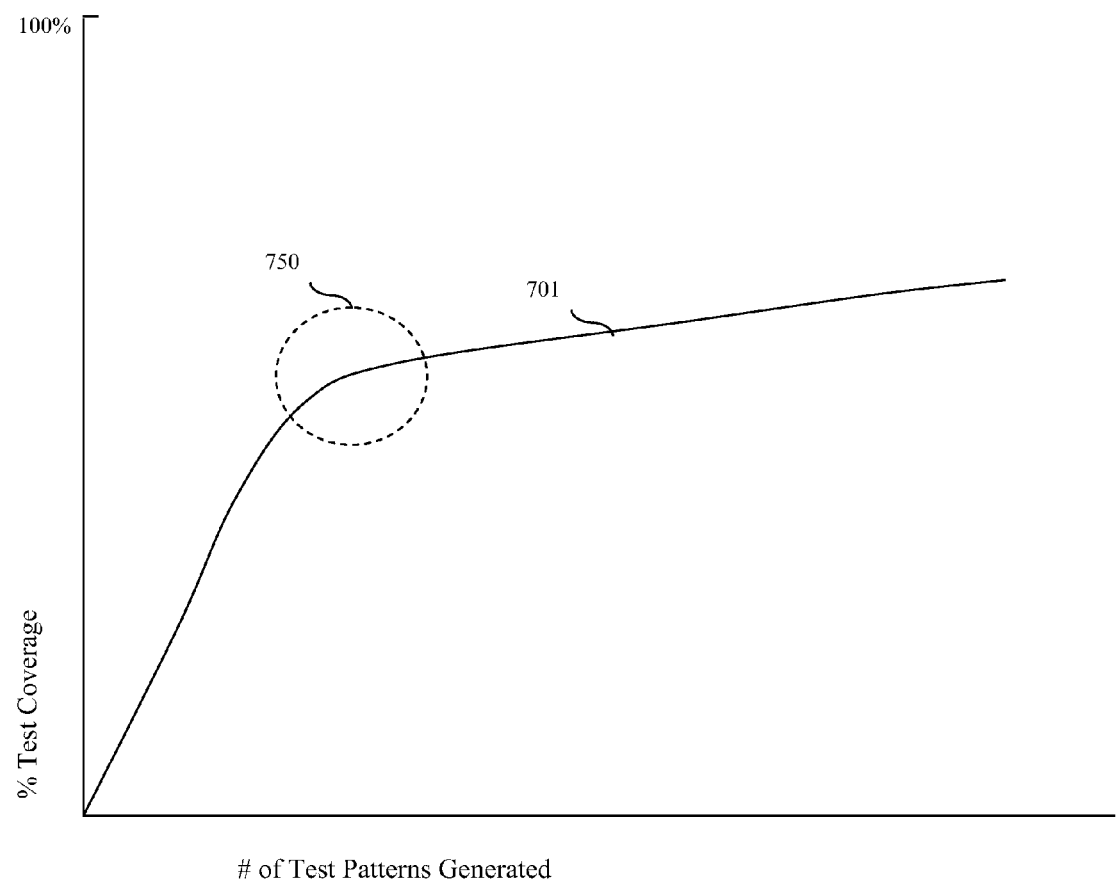
FIG. 7 is a graph illustrating test coverage achievable with conventional techniques.

Unfortunately, during at-speed testing, misalignment of clock signals can occur as signals are exchanged between different circuit partitions, e.g., asynchronous clock domains. To prevent such asynchronous captures across clock domains, functional clock domains are typically tested one domain at a time (see U.S. Patent Application Publication No. US 2008/0222472 of Grise et al., which is incorporated herein by reference). As a result, test pattern count can be high, especially for large clock domains. Furthermore, as automatic test pattern generation, particularly in the case of a large domain, proceeds, a leveling-out or "knee" in the percentage of test coverage curve is observed. That is, as illustrated in the test cover curve 701 of FIG. 7, initially each test pattern generated by an ATPG will result in an increase in test coverage (i.e., an increase in the percentage of faults detected with each test pattern). Then, after a point (see "knee" 750 of curve 701), each additional test pattern generated will result in only a minimal increase in test coverage. Thus, to achieve the highest possible test coverage a large number of test patterns must be generated and the law of diminishing returns takes over (i.e., it is no longer cost effective to generate test patterns). Therefore, there is not only a need in the art for a method for automatically generating test patterns for an at-speed structural test of an integrated circuit device that reduces test pattern count particularly for large circuit partitions, e.g., clock domains, but also a method that does so such that the highest test coverage may be achieved while remaining below a test pattern budget.

In view of the foregoing, disclosed herein are embodiments of a system and method for automatically selecting and generating test patterns for an at-speed structural test of an integrated circuit device. The embodiments use an incremental approach to test pattern selection and generation. Specifically, a test pattern generation pass is started and proceeds until the "knee" of the simulated test coverage curve is observed (i.e., until the percentage of simulated faults detected no longer increases or only minimally increases with each new test pattern generated). Next, the test patterns are optionally reordered and some are removed. Then, another test pattern generation pass is started. The process is repeated iteratively until some predetermined final stopping criterion is met. By performing multiple test pattern generation passes and reducing the number of available test patterns that can be generated with each pass, the method exploits the initial increase in the test coverage curve inherent in each pass and limits the overall test pattern count.

Figure 1:
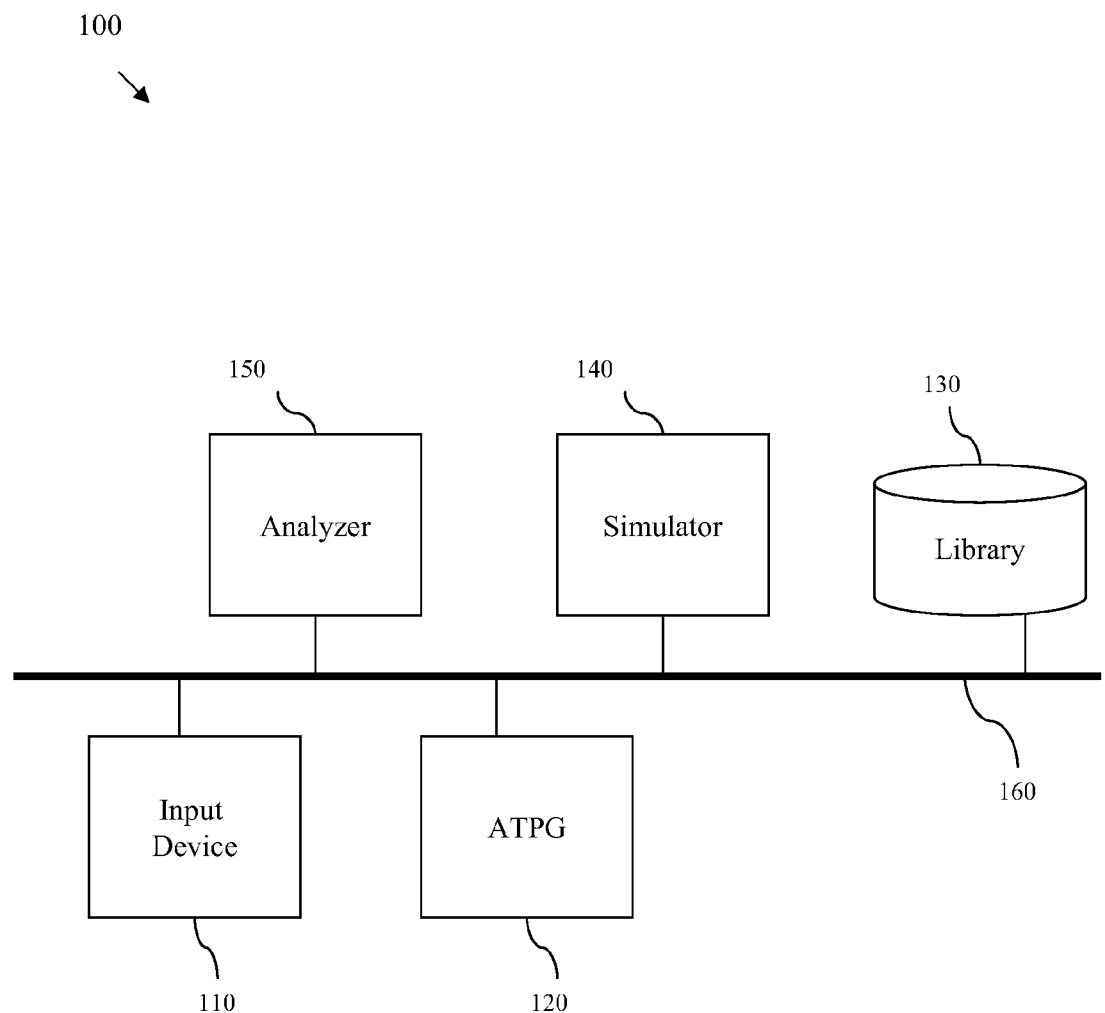
FIG. 1 is a block diagram illustrating an embodiment of a system of the present invention.

Referring to FIG. 1, disclosed herein are embodiments of a system 100 for automatically selecting and generating test patterns for an at-speed structural test of a circuit partition group (i.e., a group of one or more different circuit partitions, for example, one or more different clock domains, power domains, or any other suitable circuit partitions) of a specific integrated circuit device. The system 100 comprises an input device 110 (e.g., a graphical user interface (GUI)), an automatic test pattern generator (ATPG) 120, a library 130, a simulator 140 and a data analyzer 150.

The ATPG 120 can comprise a computer processing unit (CPU), computer system, or the like, having software tools capable of test pattern generation. Those skilled in the art will recognize that a "test pattern" is typically a series of 1's and 0's that are applied, during an at-speed structural test, by automatic test equipment (ATE) to a level sensitive scan design (LSSD) incorporated into an integrated circuit device. The output of the LSSD with each applied test pattern will indicate the existence or lack thereof of one or more particular faults.

Prior to testing, an optimal set of test patterns is selected for maximum test coverage (i.e., to ensure that most, if not all, faults will be detected). In order to select this optimal set of test patterns, the ATPG 120 will access a library 150 (i.e., a database or other memory) of previously defined test patterns indexed by faults and will identify a set of available test patterns associated with potential faults that may occur in the integrated circuit device. The aforementioned library of previously defined test patterns can either be constructed by any one or more of the known test generation procedures from prior art, or supplied by an external source, e.g., the circuit designer. The ATPG 120 will then begin processing to determine which of these available test patterns should be applied to the integrated circuit device during testing in order to achieve optimal test coverage. The present invention provides a means of achieving the highest possible test coverage, while still remaining below a test pattern budget.

Specifically, in the embodiments of the system 100 of the present invention, once the set of available test patterns is determined, the ATPG 120 will perform a first test pattern generation pass for a specific circuit partition group (i.e., for a specific group of one or more different clock domains, power domains, etc.) within the integrated circuit device. During this first test pattern generation pass, the ATPG 120 will serially (i.e., one at a time) generate test patterns from the set of available test patterns and, as each test pattern is generated, will input that test pattern into a simulator 140.

The simulator 140 can be integrated into the ATPG 120 itself. Alternatively, the simulator 140 can comprise a discrete computer processing unit (CPU), computer system, or the like, which is in communication with the ATPG 120 either directly or via a bus 160 (as shown)). The simulator 140 provides a means by which the test patterns can be applied to a simulation model of the integrated circuit device in conjunction with a target fault model. More specifically, the test patterns from the ATPG 120 are received by the simulator 140 and are applied to a level sensitive scan design (LSSD) in the specific circuit partition group of the integrated circuit device, as simulated with a predetermined number of potential faults by the simulator 140.

Figure 2:
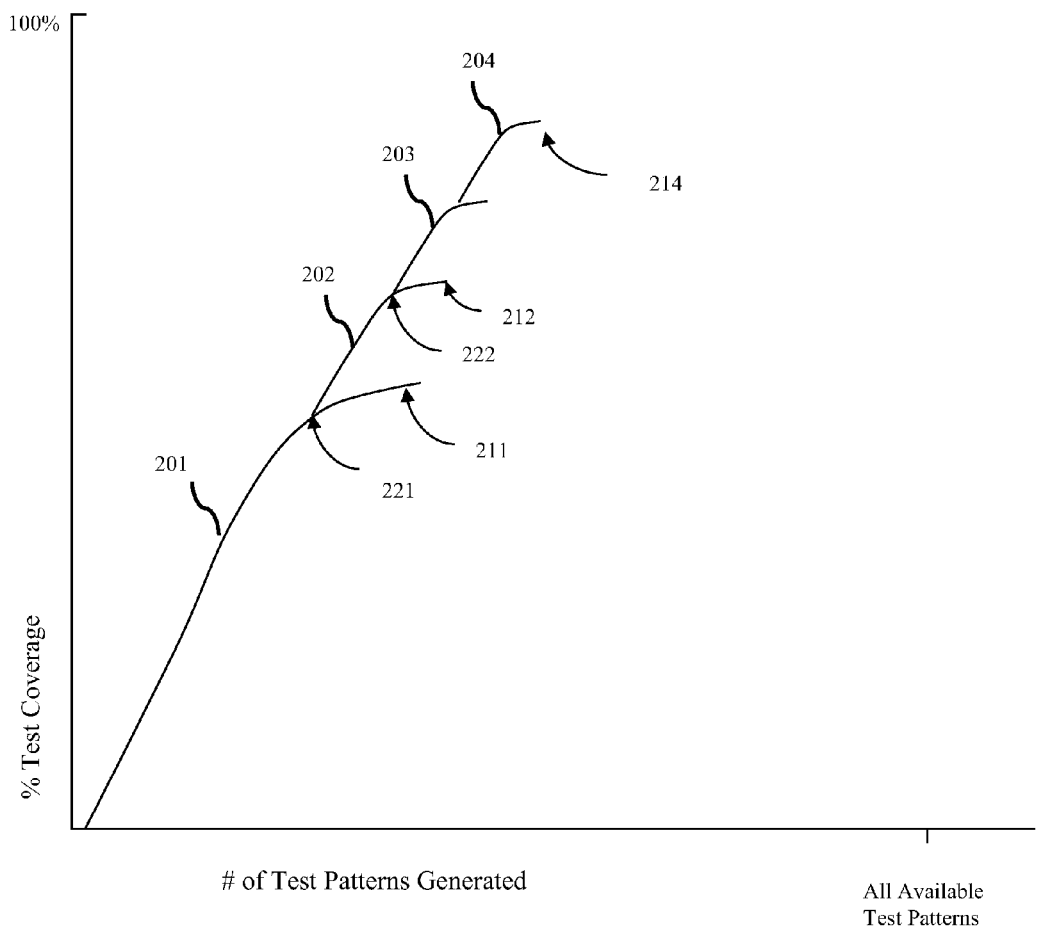
FIG. 2 is a graph illustrating test coverage achievable with the system and method of the present invention.

Also, during this first test pattern generation pass, the data analyzer 150 (which is in communication with the ATPG 120 and simulator 140 either directly or via a bus 160 (as shown)) will determine test coverage with each test pattern that is generated and applied to the simulation model (i.e., can determine simulated test coverage). That is, for each test pattern generated and input into the simulator 140 during the first test pattern generation pass, the analyzer 150 will receive the output of the simulator 140. The analyzer 150 will then compare the output of the simulator 140 with an expected output to detect simulated faults. Based on the number of simulated faults detected with each test pattern, the analyzer 150 will determine and plot simulated test coverage (i.e., will determine and plot the percentage of simulated faults detected with each test pattern generated during the first test pattern generation pass). FIG. 2 shows an illustration of a test coverage curve 201 plotted during the first test pattern generation pass.

With each test pattern generated during the first test pattern generation pass, the analyzer 150 will communicate the simulated test coverage back to the ATPG 120. Then, when at least one first predetermined stopping criterion is met, the ATPG 120 will stop the first test pattern generation pass (see stopping point 211 of curve 201 of FIG. 2) such that only a sub-set of the available test patterns is actually generated. This sub-set will comprise less than all of the available test patterns in the set. This first predetermined stopping criterion can specifically be related to test coverage and can comprise, for example, any one of the following: (1) a pre-set maximum number of test patterns generated, during a single test pattern generation pass; (2) a pre-set maximum test coverage achieved, during a single test pattern generation pass; and (3) a pre-determined minimum slope of a test coverage curve achieved, during a single test pattern generation pass (e.g., a 45 degree knee in the test coverage curve). Each first predetermined stopping criterion can be set by default or can be user-specified (e.g., via the input device 110).

Once the first test pattern generation pass is stopped, the ATPG 120 can, optionally, reorder the test patterns in the sub-set. For example, the ATPG 120 can rank the test patterns in the sub-set based on usefulness (i.e., based on the number of the detected faults with each test pattern generated). It should be noted that the number of the detected faults used for such a ranking can be an absolute number of detected faults. For example, if a first test pattern in a pass detects 10 faults and a second test pattern in the same pass detects 11 faults, then the second test pattern will be considered more useful as it has a greater absolute number of detected faults. This would be the case regardless of whether the second test pattern detects 11 new faults or only 1 new fault. Alternatively, the number of detect faults used for such a ranking can be a cumulative number of detected faults (i.e., can be based on newly detected faults only). For example, if a first test pattern in a pass detects 10 faults, a second test pattern in a pass detects 11 faults with only 2 being new and a third test pattern in a pass detects 8 with all being new, then the first test pattern would be ranked most useful and the second test pattern would be ranked least useful.

Next, the ATPG 120 will remove (i.e., clip) at least one of the test patterns from the sub-set to a point at or blow the knee of the curve 201 (see point 221). For example, the ATPG 120 can remove one or more of the least useful test patterns. That is, the ATPG 120 can remove a predetermined number of test patterns having the least number of detected faults, thereby removing heuristics that restrict the test generator to certain paths. This removal process can be based on at least one first predetermined removal criterion. The at least one first predetermined removal criterion can comprise, for example, at least one of the following: (1) a pre-set number of test patterns to be removed from the sub-set; (2) a pre-set number of test patterns to remain in the sub-set; (3) a pre-defined ratio between the number of test patterns to be removed from the subset and the number of test patterns to remain in the sub-set;

and (4) a number of test patterns corresponding to a location, having a predetermined slope (e.g., 60 degrees), on a test coverage curve acquired during the first test generation pass. The at least one first predetermined removal criterion can be set by default or can be user-specified (e.g., via the input device 110).

After the test patterns in the sub-set from the first test pattern generation pass are re-ordered (optionally) and after one or more of the test patterns from this sub-set are removed, the ATPG 120 can perform a second test pattern generation pass for the circuit partition group. During this second test pattern generation pass, the ATPG 120 will serially generate test patterns from the remaining test patterns in the sub-set and, as each test pattern is generated, will input that test pattern into the simulator 140. Again, the test patterns from the ATPG 120 are received by the simulator 140 and are applied to a level sensitive scan design (LSSD) in the specific circuit partition group of the integrated circuit device, as simulated with a predetermined number of potential faults by the simulator 140.

During this second test pattern generation pass, the data analyzer 150 will again determine and plot simulated test coverage with each test pattern that is generated and that is applied to the simulation model. That is, for each test pattern generated and input into the simulator 140 during the second test pattern generation pass, the analyzer 150 will receive the output of the simulator 140. The analyzer 150 will then compare the output of the simulator 140 with an expected output to detect simulated faults. Based on the number of simulated faults detected with each test pattern, the analyzer 150 will determine simulated test coverage (i.e., will determine the percentage of simulated faults detected with each test pattern generated during the second test pattern generation pass). FIG. 2 further shows an illustration of a test coverage curve 202 plotted during the second test pattern generation pass.

With each test pattern generated during the second test pattern generation pass, the analyzer 150 will communicate the simulated test coverage back to the ATPG 120. Then, when at least one second predetermined stopping criterion is met, the ATPG 120 will stop the second test pattern generation pass (e.g., see stopping point 212 of curve 202 of FIG. 2) such that only a second sub-set of the test patterns is actually generated. This second sub-set will comprise less than all of the test patterns remaining in the sub-set from the first test pattern generation pass. The second predetermined stopping criterion can specifically be related to test coverage and can comprise, for example, any one of the following: (1) a pre-set maximum number of test patterns generated, during a single test pattern generation pass; (2) a pre-set maximum test coverage achieved, during a single test pattern generation pass; and (3) a pre-determined minimum slope of a test coverage curve achieved, during a single test pattern generation pass (e.g., a 45 degree knee in the test coverage curve). It should be noted that the at least one second predetermined stopping criterion can be either the same as or different from the at least one first predetermined stopping criterion used in conjunction with the first test pattern generation pass. Furthermore, each second predetermined stopping criterion can be set by default or can be user-specified (e.g., via the input device 110).

Once the second test pattern generation pass is stopped, the ATPG 120 can, optionally, reorder the test patterns in the second sub-set. For example, the ATPG 120 can rank the test patterns in the second sub-set based on usefulness (i.e., based on the number of the detected faults with each test pattern generated). Again, the number of the detected faults used for such a ranking can be an absolute number or a cumulative number of detected faults.

Next, the ATPG 120 will remove (i.e., clip) at least one of the test patterns from the second sub-set to a point at or below the knee of the curve 202 (se point 222). For example, the ATPG 120 can remove one or more of the least useful test patterns. That is, the ATPG 120 can remove a predetermined number of test patterns having the least number of detected faults, thereby removing Heuristics that restrict the test generator to certain paths. This removal process can be based on at least one second predetermined removal criterion. The at least one second predetermined removal criterion can comprise, for example, at least one of the following: (1) a pre-set number of test patterns to be removed from the sub-set; (2) a pre-set number of test patterns to remain in the sub-set; (3) a pre-defined ratio between the number of test patterns to be removed from the subset and the number of test patterns to remain in the sub-set; and (4) a number of test patterns corresponding to a location, having a predetermined slope (e.g., 60 degrees), on a test coverage curve acquired during the first test generation pass. It should be noted that the at least one second predetermined removal criterion can be either the same as or different from the at least one first predetermined removal criterion used in conjunction with the first test pattern generation pass. Furthermore, each second predetermined removal criterion can be set by default or can be user-specified (e.g., via the input device 110).

The ATPG 120 can iteratively perform additional test pattern generation passes (e.g., see curves 203, 204 of FIG. 2) in this same manner until a predetermined final stopping criterion is met (see final stopping point 214 of FIG. 2). The predetermined final stopping criterion can comprise, for example, a pre-set maximum sum of all test patterns generated during all test pattern generation passes. Alternatively, the predetermined final stopping criterion can comprise a pre-set minimum slope of a curve representing total test coverage over total number of test patterns generating during all of the test pattern generation passes. By performing multiple test pattern generation passes and reducing the number of available test patterns that can be generated with each pass, the system exploits the initial increase in the test coverage curve inherent in each pass and limits the overall test pattern count.

Figure 3:
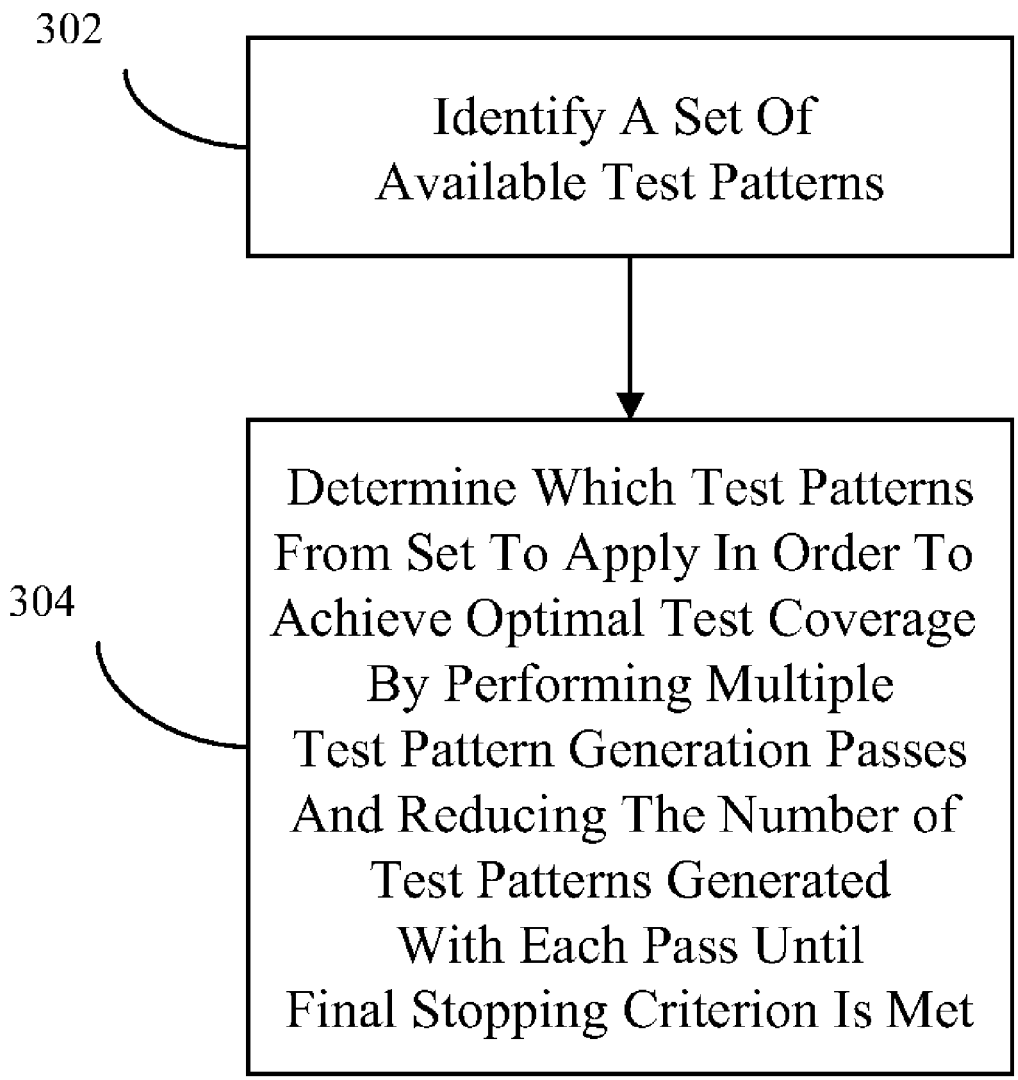
FIG. 3 is a flow diagram illustrating an embodiment of the method of the present invention.

Referring to FIG. 3, also disclosed herein are embodiments of a method for automatically selecting and generating test patterns for an at-speed structural test of a circuit partition group of an integrated circuit device. As discussed above, a circuit partition group can comprise a group of one or more different circuit partitions (e.g., one or more different clock domains, power domains, or any other suitable circuit partitions) of a specific integrated circuit device. The method embodiments comprise accessing a library (i.e., a database or other memory) of previously defined test patterns indexed by faults and identifying a set of available test patterns associated with potential faults that may occur in the integrated circuit device (302). Then, a determination is made as to which of these available test patterns should be applied to the integrated circuit device during testing in order to achieve the optimal test coverage (304). The present invention provides method for achieving the highest possible test coverage, while still remaining below a test pattern budget.

Figure 4:
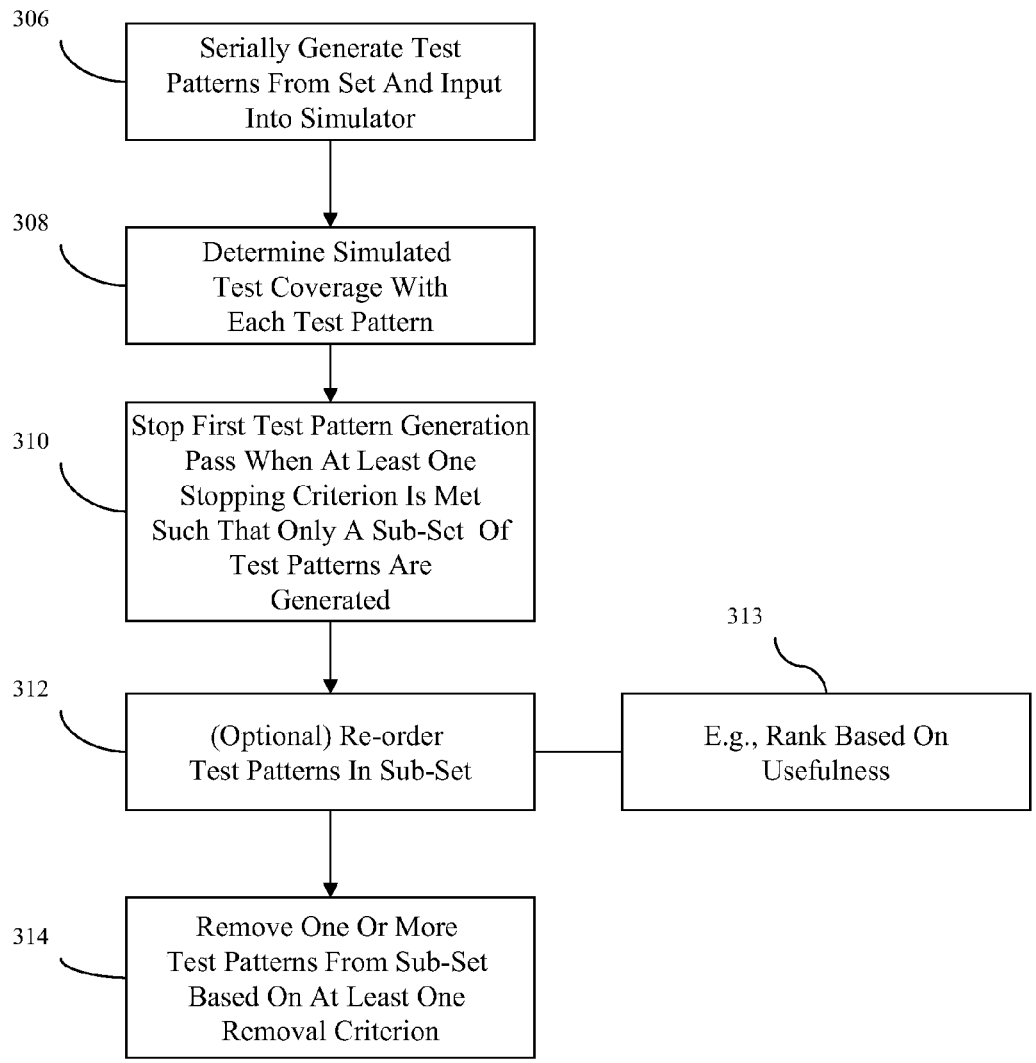
FIG. 4 is a flow diagram illustrating a first test pattern generation pass.

Specifically, referring to FIG. 4 in combination with FIG. 1 in the embodiments of the method of the present invention, once the set of available test patterns is determined (i.e., identified), a first test pattern generation pass for a specific circuit partition group (i.e., for a specific group of one or more different clock domains, power domains, etc.) within the integrated circuit device will be performed. During this first test pattern generation pass, test patterns from the set of available test patterns will be serially generated (i.e., generated one at a time) by an automatic test pattern generator (ATPG) 120 and input into a simulator 140 (306). The test patterns are applied, by the simulator 140, to a simulation model of the integrated circuit device in conjunction with a target fault model. More specifically, the test patterns are applied to a level sensitive scan design (LSSD) in the specific circuit partition group of the integrated circuit device, as simulated with a predetermined number of potential faults by the simulator 140.

Also, during this first test pattern generation pass, test coverage is determined with each test pattern that is generated and that is applied to the simulation model (308). That is, for each test pattern generated by the ATPG 120 and input into the simulator 140 during the first test pattern generation pass, the analyzer 150 will receive the output of the simulator 140. The analyzer 150 will then compare the output of the simulator 140 with an expected output to detect simulated faults. Based on the number of simulated faults detected with each test pattern, the analyzer 150 will determine and plot simulated test coverage (i.e., will determine and plot the percentage of simulated faults detected with each test pattern generated during the first test pattern generation pass). FIG. 2 shows an illustration of a test coverage curve 201 plotted during step 308 of the first test pattern generation pass.

With each test pattern generated during the first test pattern generation pass, the analyzer 150 will communicate the simulated test coverage back to the ATPG 120. Then, when at least one first predetermined stopping criterion is met, the first test pattern generation pass will stop (see stopping point 211 of curve 201 of FIG. 2) such that only a sub-set of the available test patterns is actually generated (310). This sub-set will comprise less than all of the available test patterns in the set. This first predetermined stopping criterion can specifically be related to test coverage and can comprise, for example, any one of the following: (1) a pre-set maximum number of test patterns generated, during a single test pattern generation pass; (2) a pre-set maximum test coverage achieved, during a single test pattern generation pass; and (3) a pre-determined minimum slope of a test coverage curve achieved, during a single test pattern generation pass (e.g., a 45 degree knee in the test coverage curve). Each first predetermined stopping criterion can be set by default or can be user-specified (e.g., via the input device 110).

Once the first test pattern generation pass is stopped, the test patterns in the sub-set can optionally be re-ordered (312). For example, the test patterns in the sub-set can be ranked by the ATPG 120 based on usefulness (i.e., based on the number of the detected faults with each test pattern generated) (313). It should be noted that the number of the detected faults used for such a ranking can be an absolute number of detected faults. For example, if a first test pattern in a pass detects 10 faults and a second test pattern in the same pass detects 11 faults, then the second test pattern will be considered more useful as it has a greater absolute number of detected faults. This would be the case regardless of whether the second test pattern detects 11 new faults or only 1 new fault. Alternatively, the number of detect faults used for such a ranking can be a cumulative number of detected faults (i.e., can be based on newly detected faults only). For example, if a first test pattern in a pass detects 10 faults, a second test pattern in a pass detects 11 faults with only 2 being new and a third test pattern in a pass detects 8 with all being new, then the first test pattern would be ranked most useful and the second test pattern would be ranked least useful.

Next, at least one of the test patterns from the sub-set can be removed (i.e., clipped), to a point at or below the knee of the test coverage curve (314, see point 221 of curve 201 of FIG. 2). For example, the ATPG 120 can remove one or more of the least useful test patterns (315). That is, the ATPG 120 can remove a predetermined number of test patterns having the least number of detected faults, thereby removing Heuristics that restrict the test generator to certain paths. This removal process can be based on at least one first predetermined removal criterion. The at least one first predetermined removal criterion can comprise, for example, at least one of the following: (1) a pre-set number of test patterns to be removed from the sub-set; (2) a pre-set number of test patterns to remain in the sub-set; (3) a pre-defined ratio between the number of test patterns to be removed from the subset and the number of test patterns to remain in the sub-set; and (4) a number of test patterns corresponding to a location, having a predetermined slope (e.g., 60 degrees), on a test coverage curve acquired during the first test generation pass. The at least one first predetermined removal criterion can be set by default or can be user-specified (e.g., via the input device 110).

Figure 5:
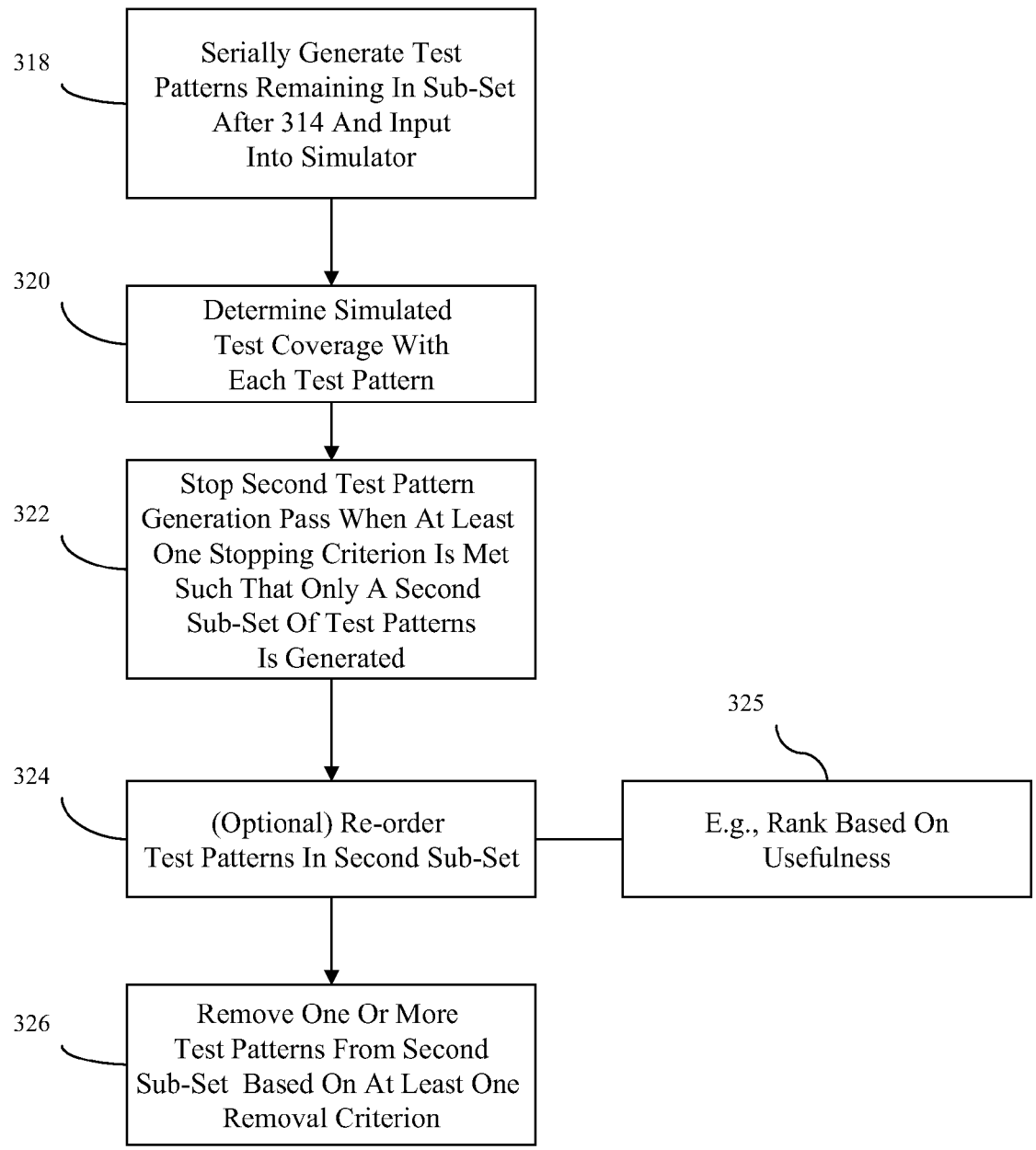
FIG. 5 is a flow diagram illustrating a second test pattern generation pass.

Referring to FIG. 5 in combination with FIG. 1, after the test patterns in the sub-set from the first test pattern generation pass are re-ordered (optionally, at process 312-313) and after one or more of the test patterns from this sub-set are removed (at process 314), a second test pattern generation pass for the clock domain group of the integrated circuit device can be performed. During this second test pattern generation pass, test patterns from the remaining test patterns in the subset are serially (i.e., one at a time) generated (e.g., by the ATPG 120) and, as each test pattern is generated, it is input into the simulator 140 (318). Again, the test patterns from the ATPG 120 are received by the simulator 140 and are applied to a level sensitive scan design (LSSD) in the specific circuit partition group of the integrated circuit device, as simulated with a predetermined number of potential faults by the simulator 140.

During this second test pattern generation pass, simulated test coverage will again be determined and plotted (e.g., by the data analyzer 150) with each test pattern that is generated and that is applied to the simulation model (320). That is, for each test pattern generated and input into the simulator 140 during the second test pattern generation pass, the analyzer 150 will receive the output of the simulator 140. The analyzer 150 will then compare the output of the simulator 140 with an expected output to detect simulated faults. Based on the number of simulated faults detected with each test pattern, the analyzer 150 will determine simulated test coverage (i.e., will determine the percentage of simulated faults detected with each test pattern generated during the second test pattern generation pass). FIG. 2 further shows an illustration of a test coverage curve 202 plotted during step 320 of the second test pattern generation pass.

With each test pattern generated during the second test pattern generation pass, the analyzer 150 will communicate the simulated test coverage back to the ATPG 120. Then, when at least one second predetermined stopping criterion is met, the second test pattern generation pass will stop (e.g., see stopping point 212 of curve 202 of FIG. 2) such that only a second sub-set of the test patterns is actually generated (322). This second sub-set will comprise less than all of the test patterns remaining in the sub-set from the first test pattern generation pass. The second predetermined stopping criterion can specifically be related to test coverage and can comprise, for example, any one of the following: (1) a pre-set maximum number of test patterns generated, during a single test pattern generation pass; (2) a pre-set maximum test coverage achieved, during a single test pattern generation pass;

and (3) a pre-determined minimum slope of a test coverage curve achieved, during a single test pattern generation pass (e.g., a 45 degree knee in the test coverage curve). It should be noted that the at least one second predetermined stopping criterion can be either the same as or different from the at least one first predetermined stopping criterion used in conjunction with the first test pattern generation pass. Furthermore, each second predetermined stopping criterion can be set by default or can be user-specified (e.g., via the input device 110).

Once the second test pattern generation pass is stopped (at process 322), the test patterns in the second sub-set can optionally be re-ordered. For example, the test patterns in the second sub-set can be ranked by the ATPG 120 based on usefulness (i.e., based on the number of the detected faults with each test pattern generated). Again, the number of the detected faults used for such a ranking can be an absolute number or a cumulative number of detected faults.

Next, at least one of the test patterns from the second sub-set can be removed (i.e., clipped) (324, see point 222 of curve 202 of FIG. 2)). For example, the ATPG 120 can remove one or more of the least useful test patterns (325). That is, the ATPG 120 can remove a predetermined number of test patterns having the least number of detected faults, thereby removing Heuristics that restrict the test generator to certain paths. This removal process can be based on at least one second predetermined removal criterion. The at least one second predetermined removal criterion can comprise, for example, at least one of the following: (1) a pre-set number of test patterns to be removed from the sub-set; (2) a pre-set number of test patterns to remain in the sub-set; (3) a pre-defined ratio between the number of test patterns to be removed from the subset and the number of test patterns to remain in the sub-set; and (4) a number of test patterns corresponding to a location, having a predetermined slope (e.g., 60 degrees), on a test coverage curve acquired during the first test generation pass. It should be noted that the at least one second predetermined removal criterion can be either the same as or different from the at least one first predetermined removal criterion used in conjunction with the first test pattern generation pass. Furthermore, each second predetermined removal criterion can be set by default or can be user-specified (e.g., via the input device 110).

Additional test pattern generation passes can be iteratively performed (e.g., see curves 203, 204 of FIG. 2) in this same manner until a predetermined final stopping criterion is met (see final stopping point 214 of FIG. 2 and step 304 of FIG. 3). That is, the above-described test pattern generation, stopping, re-ordering and removing processes can be repeatedly performed until at least one predetermined final stopping criterion is met. The predetermined final stopping criterion can comprise, for example, a pre-set maximum sum of all test patterns generated during all test pattern generation passes. Alternatively, the predetermined final stopping criterion can comprise a pre-set minimum slope of a curve representing total test coverage over total number of test patterns generating during all of the test pattern generation passes. By performing multiple test pattern generation passes and reducing the number of available test patterns that can be generated with each pass, the system exploits the initial increase in the test coverage curve inherent in each pass and limits the overall test pattern count.

Finally, also disclosed is a computer program product comprising a computer usable medium having computer useable program code embodied therewith. The computer usable program code is configured to perform the above-described method for automatically generating test patterns for at-speed structural test of a circuit partition group of an integrated circuit device. More specifically, the embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 6:
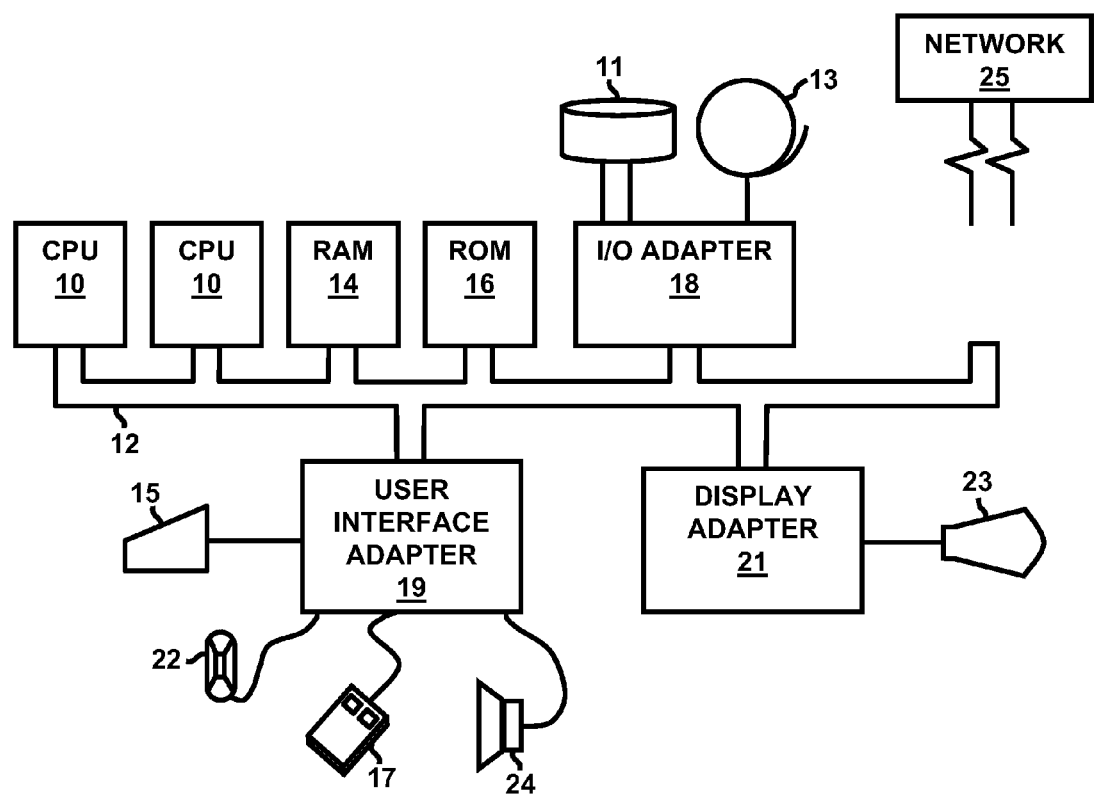
FIG. 6 is a schematic diagram illustrating an exemplary hardware environment that can be used to implement the embodiments of the invention.

A representative hardware environment for practicing the embodiments of the invention is depicted in FIG. 6. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of a system and method for automatically selecting and generating test patterns for an at-speed structural test of an integrated circuit device. The embodiments use an incremental approach to test pattern selection and generation. Specifically, a test pattern generation pass is started and proceeds until the "knee" of the simulated test coverage curve is observed (i.e., until the percentage of simulated faults detected no longer increases or only minimally increases with each new test pattern generated). Next, the test patterns are optionally reordered and some are removed. Then, another test pattern generation pass is started. The process is repeated iteratively until some predetermined final stopping criterion is met. By performing multiple test pattern generation passes and reducing the number of available test patterns that can be generated with each pass, the method exploits the initial increase in the test coverage curve inherent in each pass and limits the overall test pattern count.

What is claimed is:

1. A system for automatically generating test patterns for an at-speed structural test of a circuit partition group of an integrated circuit device, said system comprising:
    an automatic test pattern generator performing a first test pattern generation pass for said circuit partition group, said first test pattern generation pass comprising generating test patterns from a set of available test patterns; and
    an analyzer determining, during said first test pattern generation pass, test coverage with each test pattern generated and communicating said test coverage to said generator,
    said test coverage comprising a percentage of simulated faults detected, and
    said generator further performing the following:
        stopping said first test pattern generation pass, based on at least one predetermined stopping criterion related to said test coverage, such that only a sub-set of test patterns is generated, said sub-set comprising less than all of said available test patterns in said set;
        removing at least one test pattern from said sub-set; and
        after said removing, performing a second test pattern generation pass for said circuit partition group, said second test pattern generation pass comprising generating test patterns from said sub-set.

2. The system of claim 1, said at least one predetermined stopping criterion comprising at least one of:
    a pre-set maximum number of test patterns generated, during a single test pattern generation pass;
    a pre-set maximum test coverage achieved, during said single test pattern generation pass; and
    a pre-determined minimum slope of a test coverage curve achieved, during said single test pattern generation pass.

3. The system of claim 1, said generator further removing said at least one test pattern based on at least one predetermined removal criterion comprising at least one of:
    a pre-set number of test patterns to be removed from said sub-set;
    a pre-set number of test patterns to remain in said sub-set;
    a pre-defined ratio between said number of test patterns to be removed from said subset and said number of test patterns to remain in said sub-set; and
    a number of test patterns corresponding to a location, having a predetermined slope, on a test coverage curve acquired during said first test generation pass.

4. The system of claim 1,
    said analyzer further determining, during said second test pattern generation pass, said test coverage with each test pattern generated and communicating said test coverage to said generator; and
    said generator further performing the following:
        based on at least one second predetermined stopping criterion, stopping said second test pattern generation pass such that only a second sub-set of test patterns is generated, said second sub-set comprising less than all of said test patterns in said sub-set;
        removing at least one additional test pattern from said second sub-set; and
        iteratively performing additional test pattern generation passes until a predetermined final stopping criterion is met.

5. The system of claim 4, said predetermined final stopping criterion comprising at least one of:
    a pre-set maximum sum of all test patterns generated during all test pattern generation passes; and
    a pre-set minimum slope of a curve representing total test coverage over total number of test patterns generating during all of said test pattern generation passes.

6. The system of claim 1, said circuit partition group comprising at least one of at least one clock domain and at least one power domain.

7. The system of claim 1, said generator further re-ordering said test patterns in said sub-set, before said removing.

8. The system of claim 7, wherein said re-ordering comprises ranking said test patterns in said sub-set based on a number of detected faults with each test pattern generated and wherein said generator further removes said at least one test pattern from said sub-set based on said ranking.

9. The system of claim 8, said number of detected faults comprising one of an absolute number of detected faults and a cumulative number of detected faults.

10. A method for automatically generating test patterns for an at-speed structural test of a circuit partition group of an integrated circuit device, said method comprising:
performing a first test pattern generation pass for said circuit partition group, said first test pattern generation pass comprising generating test patterns from a set of available test patterns;
during said performing of said first test pattern generation pass, determining test coverage with each test pattern generated, said test coverage comprising a percentage of simulated faults detected;
based on at least one predetermined stopping criterion related to said test coverage, stopping said first test pattern generation pass such that only a sub-set of said available test patterns is generated, said sub-set comprising less than all of said available test patterns in said set;
removing at least one test pattern from said sub-set; and
after said removing, performing a second test pattern generation pass for said circuit partition group comprising generating test patterns from said sub-set.

11. The method of claim 10, said at least one predetermined stopping criterion comprising at least one of:
a pre-set number of test patterns to be removed from said sub-set;
a pre-set number of test patterns to remain in said sub-set;
a pre-defined ratio between said at least one test pattern and a total number of test patterns in said sub-set; and
a number of test patterns corresponding to a location, having a predetermined slope, on a test coverage curve acquired during said first test generation pass.

12. The method of claim 10, said removing being based on at least one predetermined removal criterion comprising at least one of:
a pre-set number of test patterns to be removed from said sub-set;
a pre-set number of test patterns to remain in said sub-set;
a pre-defined ratio between said number of test patterns to be removed from said subset and said number of test patterns to remain in said sub-set; and
a number of test patterns corresponding to a location, having a predetermined slope, on a test coverage curve acquired during said first test generation pass.

13. The method of claim 10, further comprising, before said removing, re-ordering said test patterns in said sub-set.

14. The method of claim 10, further comprising:
during said performing of said second test pattern generation pass, again determining said test coverage with each test pattern generated;
based on at least one second predetermined stopping criterion, stopping said second test pattern generation pass such that only a second sub-set of test patterns is generated, said second sub-set comprising less than all of said test patterns in said sub-set;
removing at least one additional test pattern from said second sub-set; and
iteratively performing additional test pattern generation passes until a predetermined final stopping criterion is met.

15. The method of claim 14, said predetermined final stopping criterion comprising at least one of:
a pre-set maximum sum of all test patterns generated during all test pattern generation passes; and
a pre-set minimum slope of a curve representing total test coverage over total number of test patterns generating during all of said test pattern generation passes.

16. The method of claim 10, said circuit partition group comprising at least one of at least one clock domain and at least one power domain.

17. A method for automatically generating test patterns for an at-speed structural test of a single circuit partition of an integrated circuit device, said method comprising:
performing a first test pattern generation pass for said circuit partition, said first test pattern generation pass comprising generating test patterns from a set of available test patterns;
during said performing of said first test pattern generation pass, determining test coverage with each test pattern generated, said test coverage comprising a percentage of simulated faults detected;
based on at least one predetermined stopping criterion related to said test coverage, stopping said first test pattern generation pass such that only a sub-set of said available test patterns is generated, said sub-set comprising less than all of said available test patterns in said set;
ranking said test patterns in said sub-set based on a number of detected faults with each test pattern generated;
based on said ranking and according to at least one predetermined removal criterion, removing at least one test pattern from said sub-set; and
after said removing, performing a second test pattern generation pass comprising generating test patterns from said sub-set.

18. The method of claim 17, said percentage being based on one of an absolute number of detected faults and a cumulative number of detected faults.

19. The method of claim 17,
said ranking further comprising reordering said test patterns from said sub-set according to usefulness with a test pattern having a greatest number of said detected faults being most useful and a test pattern having a least number of said detected faults being least useful; and
said removing further comprising removing at least said test pattern having said least number of said detected faults.

20. The method of claim 17, said at least one predetermined stopping criterion comprising at least one of:
a pre-set number of test patterns to be removed from said sub-set;
a pre-set number of test patterns to remain in said sub-set;
a pre-defined ratio between said number of test patterns to be removed from said subset and said number of test patterns to remain in said sub-set; and
a number of test patterns corresponding to a location, having a predetermined slope, on a test coverage curve acquired during said first test generation pass.

21. The method of claim 17, said at least one predetermined removal criterion comprising at least one of:
a pre-set number of test patterns to be removed from said sub-set;
a pre-set number of test patterns to remain in said sub-set;
a pre-defined ratio between said at least one test pattern and a total number of test patterns in said sub-set; and
a number of test patterns corresponding to a location, having a predetermined slope, on a test coverage curve acquired during said first test generation pass.

22. The method of claim 17, further comprising:
during said performing of said second test pattern generation pass, again determining said incremental amount of total test coverage with each test pattern generated;
based on at least one second predetermined stopping criterion, stopping said second test pattern generation pass such that only a second sub-set of test patterns is generated, said second sub-set comprising less than all of said test patterns in said sub-set;

removing at least one additional test pattern from said second sub-set; and iteratively performing additional test pattern generation passes until a predetermined final stopping criterion is met.

23. The method of claim 22, said predetermined final stopping criterion comprising at least one of:

a pre-set maximum sum of all test patterns generated during all test pattern generation passes; and a pre-set minimum slope of a curve representing total test coverage over total number of test patterns generating during all of said test pattern generation passes.

24. A non-transient computer readable medium embodying a computer program product, said non-transient computer readable medium having computer usable program code embodied therewith, said computer usable program code being configured to perform a method for automatically generating test patterns for at-speed structural test of a circuit partition group of an integrated circuit device, said method comprising:

performing a first test pattern generation pass for said circuit partition group, said first test pattern generation pass comprising generating test patterns from a set of available test patterns;

during said performing of said first test pattern generation pass, determining test coverage with each test pattern generated, said test coverage comprising a percentage of detected faults over simulated faults;

based on at least one predetermined stopping criterion related to said test coverage, stopping said first test pattern generation pass such that only a sub-set of said available test patterns is generated, said sub-set comprising less than all of said available test patterns in said set;

removing at least one test pattern from said sub-set; and after said removing, performing a second test pattern generation pass for said circuit partition group comprising generating test patterns from said sub-set.

25. The non-transient computer readable medium embodying a computer program product of claim 24, said method further comprising, before said removing, ranking said test patterns in said sub-set based on a number of detected faults with each test pattern generated, said number of detected faults comprising one of an absolute number of detected faults and a cumulative number of detected faults.

* * * * *